(12) United States Patent
Sakurai et al.

(10) Patent No.: US 8,980,001 B2
(45) Date of Patent: Mar. 17, 2015

(54) METHOD FOR MANUFACTURING EPITAXIAL WAFER AND WAFER HOLDER USED IN THE METHOD

(75) Inventors: Masaya Sakurai, Tokyo (JP); Masayuki Ishibashi, Tokyo (JP)

(73) Assignee: Sumco Corporation, Tokyo (JP)

( * ) Notice: Subject to any disclaimer, the term of this patent is extended or adjusted under 35 U.S.C. 154(b) by 89 days.

(21) Appl. No.: 13/003,440

(22) PCT Filed: Jul. 24, 2009

(86) PCT No.: PCT/JP2009/063243
§ 371 (c)(1),
(2), (4) Date: Jan. 10, 2011

(87) PCT Pub. No.: WO2010/013646
PCT Pub. Date: Feb. 4, 2010

(65) Prior Publication Data
US 2011/0114014 A1 May 19, 2011

(30) Foreign Application Priority Data

Jul. 31, 2008 (JP) ................. 2008-197723

(51) Int. Cl.
| | | |
|---|---|---|
| *C30B 25/12* | (2006.01) | |
| *H01L 21/687* | (2006.01) | |
| *C23C 16/24* | (2006.01) | |
| *C23C 16/458* | (2006.01) | |
| *C23C 16/46* | (2006.01) | |
| *C30B 29/06* | (2006.01) | |
| *H01L 21/67* | (2006.01) | |

(52) U.S. Cl.
CPC .......... *H01L 21/68742* (2013.01); *C23C 16/24* (2013.01); *C23C 16/4586* (2013.01); *C23C 16/46* (2013.01); *C30B 25/12* (2013.01); *C30B 29/06* (2013.01); *H01L 21/67115* (2013.01)
USPC ............... 117/88; 117/84; 117/200; 117/204; 118/715; 118/720; 118/722; 118/724; 118/725; 118/728; 118/729; 118/730; 118/731

(58) Field of Classification Search
USPC .............. 117/84, 88, 200, 204, 911; 118/715, 118/720, 722, 724–725, 728–731
See application file for complete search history.

(56) References Cited

U.S. PATENT DOCUMENTS

| | | | |
|---|---|---|---|
| 2003/0015141 A1* | 1/2003 | Takagi | .......................... 118/728 |
| 2003/0178145 A1* | 9/2003 | Anderson et al. | ........ 156/345.51 |

(Continued)

FOREIGN PATENT DOCUMENTS

| | | | |
|---|---|---|---|
| JP | 2000-26192 | | 1/2000 |
| JP | 2000323556 A | * | 11/2000 |

(Continued)

OTHER PUBLICATIONS

Japan Office action, dated Aug. 6, 2013 along with an english translation thereof, for JP 2008-197723.

*Primary Examiner* — Michael Kornakov
*Assistant Examiner* — Kenneth A Bratland, Jr.
(74) *Attorney, Agent, or Firm* — Greenblum & Bernstein, P.L.C.

(57) ABSTRACT

A susceptor having a recessed portion and a ring-like step portion is arranged in a reaction chamber, and a plurality of through bores are formed in a bottom wall in the recessed portion excluding the step portion. A lift pin inserted in each of the through bores temporarily holds a wafer, then a lower surface of an outer peripheral portion of the wafer is mounted on the step portion to accommodate the wafer in the recessed portion, and a raw material gas is circulated in the reaction chamber to form an epitaxial layer on a wafer surface in the recessed portion. When forming the epitaxial layer on the wafer surface, the lift pin protrudes upwards from an upper surface of the bottom wall, and a height h of a top portion of the lift pin based on the upper surface of the bottom wall as a reference is set to the range from a position where the height h exceeds 0 mm to a position immediately before the lift pin comes into contact with the wafer.

2 Claims, 2 Drawing Sheets

(56) References Cited

U.S. PATENT DOCUMENTS

2004/0144323 A1* 7/2004 Kai .............................. 118/728
2006/0130743 A1* 6/2006 Brabant et al. .................. 117/84

FOREIGN PATENT DOCUMENTS

| JP | 2007-235116 | 9/2007 |
| JP | 2007-273623 | 10/2007 |

* cited by examiner

METHOD FOR MANUFACTURING EPITAXIAL WAFER AND WAFER HOLDER USED IN THE METHOD

BACKGROUND OF THE INVENTION

1. Field of the Invention

The present invention relates to a method for manufacturing an epitaxial wafer by forming an epitaxial layer on a surface of a semiconductor wafer such as a silicon wafer placed on a susceptor in a reaction chamber while rotating this wafer and to a holder configured to hold a wafer when forming an epitaxial layer on the wafer.

2. Description of the Related Art

There has been disclosed an epitaxial wafer manufacturing apparatus having a configuration in which at least a part of a lift pin is arranged on a lower side of a susceptor on which a wafer is mounted in an epitaxial layer forming chamber, this lift pin is inserted into a through bore provided in the susceptor to push up a wafer after forming an epitaxial layer, and heat transfer suppressing means suppresses heat transferred to a lift pin arrangement region via the lift pin at the time of forming the epitaxial layer between a wafer upper surface side and a susceptor lower surface side (see, e.g., Patent Document 1). This apparatus is configured in such a manner that a head portion of the lift pin is accommodated in the through bore of the susceptor and a leg portion protrudes toward a lower side of the susceptor. Further, in the heat transfer suppressing means, the lift pin is formed of a material having thermal conductivity that is less than 128 W/m·K lower than thermal conductivity of the susceptor. Furthermore, at least an upper surface side of the lift pin insertion through bore formed in the susceptor is tapered so that a bore cross-sectional area can be reduced from the upper surface side toward a lower surface side, and the head portion of the lift pin is formed into a dish-like shape so that the head portion can be fitted into the through bore without gap with an upper surface thereof being substantially conformed with an upper surface of the susceptor. It is to be noted that infrared lamps are arranged on an upper side and a lower side of the epitaxial layer forming chamber, and a wafer mounted on the susceptor is heated from both the upper and lower sides by these lamps. In the thus configured epitaxial wafer manufacturing apparatus, since the heat transfer suppressing means suppresses heat transfer from the upper surface side of the wafer toward the lower surface side of the susceptor via the lift pin during formation of the epitaxial layer, the heat transfer suppressing means can prevent a temperature in a region of the wafer facing the lift pin from becoming lower than a temperature of any other region. As a result, a reduction in depression of the epitaxial layer caused due to a decrease in temperature can be suppressed.

Patent Document 1
Japanese Unexamined Patent Application Publication No. 2000-323556 (claims 1 to 3, paragraph [0011], and paragraph [0025])

In the method for manufacturing an epitaxial wafer disclosed in Patent Document 1 according to the conventional technology, the lift pin is formed into a dish-like shape and the upper surface of the head portion of the lift pin is conformed with the upper surface of the susceptor so that the lift pin can be fitted into the through bore without gap. However, according to the manufacturing method disclosed in Patent Document 1, a difference in thermal conductivity is still produced due to a difference in shape or material between the susceptor and the lift pin, thermal release from the upper portion of the lift pin toward the lower portion of the same still occurs, and hence there arises a problem that a film thickness of the epitaxial layer at a position where the epitaxial layer faces the lift pin becomes uneven when an output ratio of the upper lamp and the lower lamp is changed.

On the other hand, since the susceptor that supports the wafer is present on the lower surface of this wafer, an output from the lower lamp is set to be larger than an output from the upper lamp so that the upper surface and the lower surface of the wafer can be uniformly heated. In this case, a temperature on a wafer back surface becomes lower than a temperature of the susceptor, and silicon is deposited on the wafer back surface, whereby there occurs a problem that the film thickness of the epitaxial layer at a position where the epitaxial layer faces the lift pin becomes uneven when lowering the output from the lower lamp is tried.

SUMMARY OF THE INVENTION

Accordingly, the object of the present invention is to provide a method for manufacturing an epitaxial layer that can avoid generation of irregularities on an epitaxial layer at a position where the epitaxial layer faces a lift pin and prevent silicon from being deposited on a wafer back surface even though an output ratio of an upper lamp and a lower lamp is changed, and to provide a wafer holder used in this method.

According to a first aspect of the present invention, there is provided a method for manufacturing an epitaxial wafer comprising a step of; arranging in a reaction chamber a susceptor that has a recessed portion and a ring-like step portion formed in the recessed portion and has a plurality of through bores formed in a bottom wall of the recessed portion excluding the step portion; temporarily holding a wafer by lift pins inserted in the through bores; mounting a lower surface of an outer peripheral portion of the wafer on the step portion to accommodate the wafer in the recessed portion; and circulating a raw material gas in the reaction chamber to form an epitaxial layer on a surface of the wafer accommodated in the recessed portion, wherein, when forming the epitaxial layer on the wafer surface, each of the lift pins protrudes upwards from an upper surface of the bottom wall, and a height h of a top portion of each lift pin based on the upper surface of the bottom wall as a reference is set to fall within the range from a position at which the height h exceeds 0 mm to a position immediately before the lift pin comes into contact with the wafer.

According to a second aspect of the present invention, there is provided the invention based on the first aspect, wherein a distance H between an extended surface of an upper surface of the step portion of the susceptor and an extended surface of the upper surface of the bottom wall at a position of the lift pin is 0.1 to 1 mm.

According to a third aspect of the present invention, there is provided the invention based on the first aspect, wherein, when forming the epitaxial layer on the wafer surface, each of the lift pins protrudes upwards from the upper surface of the bottom wall, and the height h of the top portion of the lift pin based on the upper surface of the bottom wall as a reference is set to fall within the range of 0.05 mm or above and a position immediately before the lift pin comes into contact with the wafer.

According to a fourth aspect of the present invention, there is provided the invention based on the first to third aspects, wherein the susceptor is formed of carbon covered with an SiC film and the lift pin is formed of any one of SiC, glassy carbon, and quartz.

According to a fifth aspect of the present invention, there is provided a wafer holder comprising: a susceptor that has a"

recessed portion and a ring-like step portion formed in the recessed portion, has a plurality of through bores formed in a bottom wall of the recessed portion excluding the step portion, and is arranged in a reaction chamber; and lift pins that are inserted in the through bores and temporarily hold a wafer, the wafer being temporarily held by the lift pins, a lower surface of an outer peripheral portion of the wafer being then mounted on the step portion to accommodate the wafer in the recessed portion, a raw material gas being circulated in the reaction chamber to form an epitaxial layer on a surface of the wafer accommodated in the recessed portion, wherein, when forming the epitaxial layer on the wafer surface, each of the lift pins protrudes upwards from an upper surface of the bottom wall, and a height h of a top portion of each lift pin based on the upper surface of the bottom wall as a reference is set to fall within the range from a position at which the height h exceeds 0 mm to a position immediately before the lift pin comes into contact with the wafer.

According to a sixth aspect of the present invention, there is provided the invention based on the fifth aspect, wherein a distance H between an extended surface of an upper surface of the step portion of the susceptor and an extended surface of the upper surface of the bottom wall at a position of the lift pin in the recessed portion of the susceptor is 0.1 to 1 mm.

According to a seventh aspect of the present invention, there is provided the invention based on the fifth aspect, wherein, when forming the epitaxial layer on the wafer surface, each of the lift pins protrudes upwards from the upper surface of the bottom wall, and the height h of the top portion of the lift pin based on the upper surface of the bottom wall as a reference is set to fall within the range of 0.05 mm or above and a position immediately before the lift pin comes into contact with the wafer.

According to an eighth aspect of the present invention, there is provided the invention based on the fifth to seventh aspects, wherein the susceptor is formed of carbon covered with an SiC film and the lift pin is formed of any one of SiC, glassy carbon, and quartz.

According to the manufacturing method set forth in the first aspect and the holder set forth in the fifth aspect, even if the outputs of the upper lamp and the lower lamp are set so that the wafer and the susceptor can have the same temperature, irregularities are not produced on the epitaxial layer at the position where the epitaxial layer faces the lift pin, and the silicon is not deposited on the wafer back surface. In other words, when the output of the lower lamp higher than the output of the upper lamp in the conventional technology is lowered to become substantially equal to the output of the upper lamp, deposition of the silicon on the wafer back surface can be suppressed while maintaining planarization of the epitaxial layer, thereby improving the quality of the epitaxial wafer.

DETAILED DESCRIPTION OF THE PREFERRED EMBODIMENT

A preferred embodiment according to the present invention is described in more details with reference to the attached drawings hereinafter.

Figure 1:
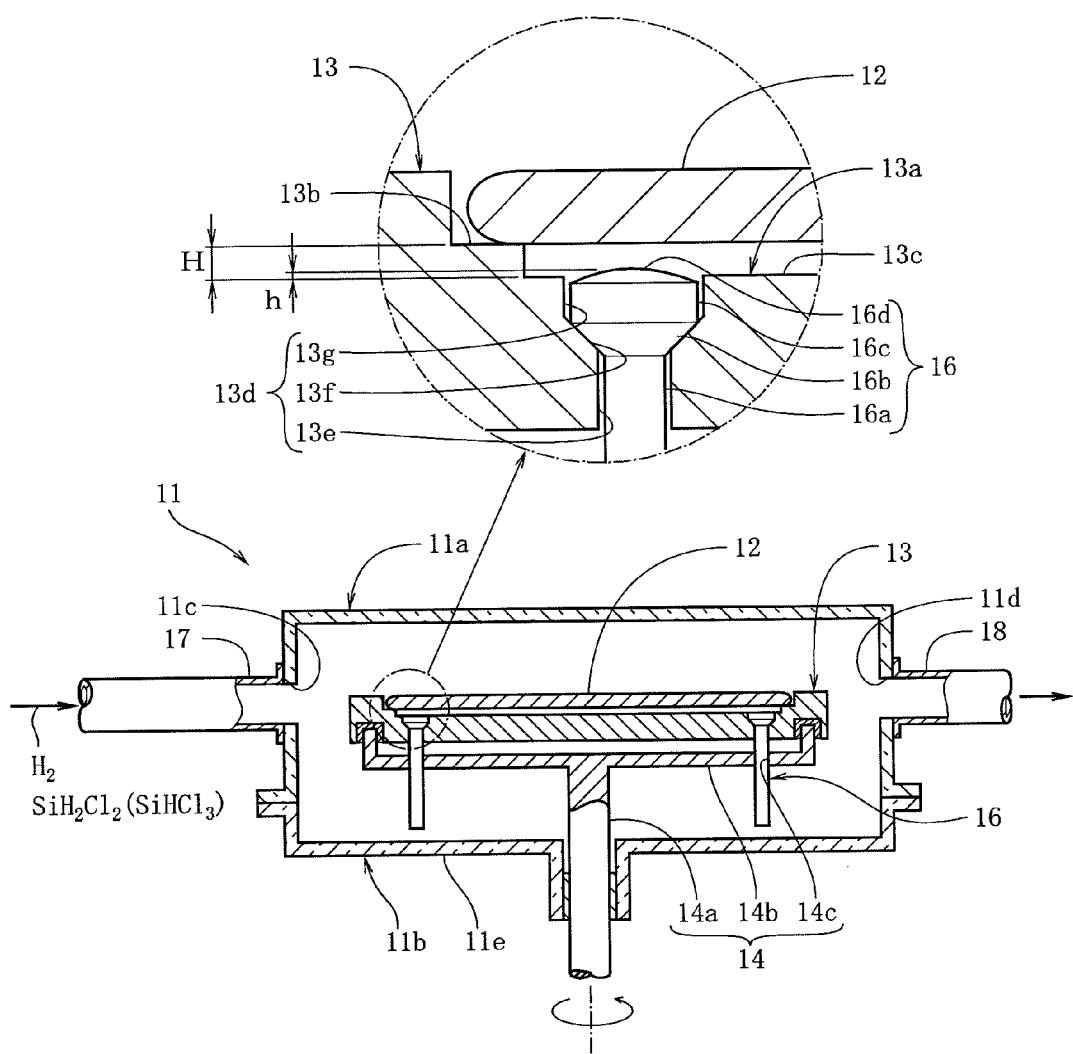
FIG. 1 is a longitudinal cross-sectional structural view of a reaction chamber showing a state that a holder according to an embodiment of the present invention is utilized to form an epitaxial layer on a silicon wafer surface.

As shown in FIG. 1, a single-wafer processing type epitaxial wafer manufacturing apparatus includes a reaction chamber 11. This reaction chamber 11 has an upper dome 11a having a substantially-inverted-bowl-like shape and a lower dome 11b having a substantially-bowl-like shape, and a space is formed in the reaction chamber 11 by closely attaching these domes 11a and 11b to each other. A susceptor 13 that supports a single silicon wafer 12 configured to grow an epitaxial layer (not shown) on a surface (an upper surface) thereof is provided in the inner space of this reaction chamber 11, and the susceptor 13 is rotatably held by a rotary shaft 14. The susceptor 13 is formed into a relatively thick discoid shape. A recessed portion 13a that accommodates the silicon wafer 12 is formed in this susceptor 13, and a ring-like step portion 13b on which an outer peripheral portion of the silicon wafer 12 is placed is formed in this recessed portion 13a. Further, the rotary shaft 14 has a rotation shaft portion 14a rotatably inserted in the center of the lower dome 11b and a discoid bearing portion 14b that is formed on an upper surface of the rotation shaft portion 14a to be integral and concentric with respect to this shaft portion 14a and accepts a lower surface of the susceptor 13. The outer diameter of the bearing portion 14b is formed slightly smaller than the outer diameter of the susceptor 13. In a bottom wall 13c of the recessed portion 13a of the susceptor 13 excluding the ring-like step portion 13b, a plurality of through bores 13d are formed on the same circumference having an axial line of the rotation shaft portion 14a in the center at equal intervals in the circumferential direction. A through hole 14c is formed in the bearing portion 14b of the rotary shaft 14 at a position where it faces the through bore 13d.

On the other hand, a lift pin 16 is inserted into the through bore 13d and the through hole 14c. The lift pin 16 has a lift shaft portion 16a and a lift head portion 16c that is provided on an upper surface of this lift shaft portion 16a to be integral with the lift shaft portion 16a through a lift tapered portion 16b and has a larger diameter than that of the lift shaft portion 16a. An upper surface of the lift head portion 16c, i.e., a top portion 16d is formed into a spherical shape. The through bore 13d of the susceptor 13 has a small-diameter bore portion 13e formed with a slightly larger diameter than that of the lift shaft portion 16a of the lift pin 16, a tapered bore portion 13f that has the same taper as that of the lift tapered portion 16b and accommodates the lift tapered portion 16b, and a large-diameter bore portion 13g that is formed with a slightly larger diameter than that of the lift head portion 16c and can accommodate the lift head portion 16c. A diameter of the through hole 14c formed in the bearing portion 14b of the rotary shaft 14 is formed to be equal to the diameter of the small-diameter bore portion 13e of the through bore 13d. The susceptor 13 is formed of carbon covered with an SiC film, and the lift pin 16 is formed of any one of SiC, glassy carbon (vitreous carbon), and quartz. Furthermore, a distance H between an extended surface of the upper surface of the step portion 13b of the susceptor 13 and an extended surface of the upper surface of the bottom wall 13c in the recessed portion 13a of the susceptor 13 at a position of the lift pin 16 is set to fall within the range of 0.1 to 1 mm or, preferably 0.2 to 0.8 mm. Here, the distance H between the extended surface of the upper surface of the step portion 13b of the susceptor 13 and the extended surface of the upper surface of the bottom wall 13c in the recessed portion 13a of the susceptor 13 at the position of the lift pin 16 is restricted to the range of 0.1 to 1 mm because an inconvenience that is contact with the lift pin 16 occurs due to warpage of the wafer 12 when this distance is less than 0.1 mm and an inconvenience that is slip occurs when this distance exceeds 1 mm.

On the other hand, a gas supply opening 11c and a gas discharge opening 11d are arranged and provided in an outer peripheral surface of the upper dome 11a. One end of a gas introduction tube 17 through which a raw material gas and a carrier gas are supplied is connected to the gas supply opening 11c, and one end of a gas discharge tube 18 is connected to the gas discharge opening 11d. The gas introduction tube 17 and the gas discharge tube 18 are formed of a chlorine-resistant alloy such as hastelloy. Moreover, although not shown, an upper lamp (not shown) is provided above the upper dome 11a, and a lower lamp (not shown) is provided below the lower dome 11b. Each of these lamps is constituted of, e.g., a halogen lamp, an incandescent lamp, an arc lamp, or a graphite heater. Additionally, the raw material gas is introduced together with the carrier gas into the reaction chamber 11. Here, there are, e.g., $SiH_2Cl_2$, $SiHCl_3$, $SiH_4$, $SiCl_4$, and others as the raw material gas, and there is mainly $H_2$ as the carrier gas. The raw material gas and others introduced from the gas introduction tube 17 and the gas supply opening 11c flow through a space between the upper dome 11a and the silicon wafer 12 to form an epitaxial layer consisting of a silicon single crystal thin film on the surface of the silicon wafer 12, and they are then discharged through the gas discharge opening 11d and the gas discharge tube 18.

When forming the epitaxial layer on the surface of the silicon wafer 12, the lift pin 16 protrudes upwards from the upper surface of the bottom wall 13c, and a height h of the top portion 16d of the lift pin 16 from the upper surface of the bottom wall 13c as a reference is set to fall within the range from a position where the height h exceeds 0 mm to a position immediately before the lift pin 16 comes into contact with the silicon wafer 12, or preferably the range from 0.05 mm or above to the position immediately before the lift pin 16 comes into contact with the silicon wafer 12. Here, the height h of the top portion 16d of the lift pin 16 is restricted to the range from the position where the height h exceeds 0 mm to the position immediately before the lift pin 16 comes into contact with the silicon wafer 12 because there occurs an inconvenience that a temperature of the lift pin 16 is lowered due to heat conduction and contact of the lift pin 16 with the silicon wafer 12 causes occurrence of a damage to the wafer back surface and heat liberation from the contacted lift pin 16 since a length of the lift pin 16 is larger than a thickness of the bottom wall 13c of the susceptor 13 when the height h is not greater than 0 mm.

Figure 2:
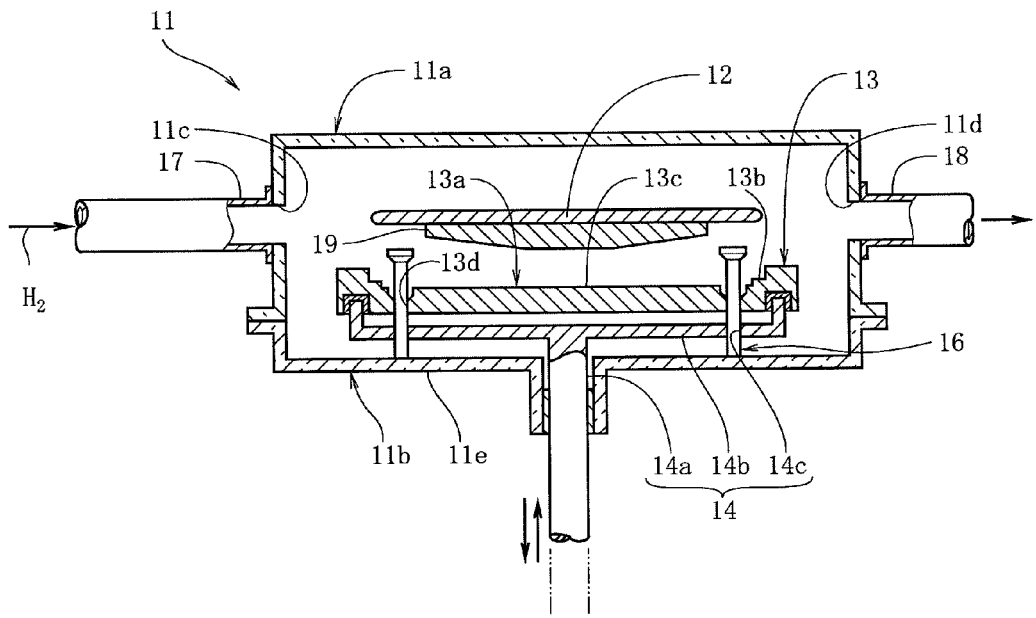
FIG. 2 is a longitudinal cross-sectional structural view associated with FIG. 1, showing a state that a lift pin of the holder temporarily holds a silicon wafer.
Figure 3:
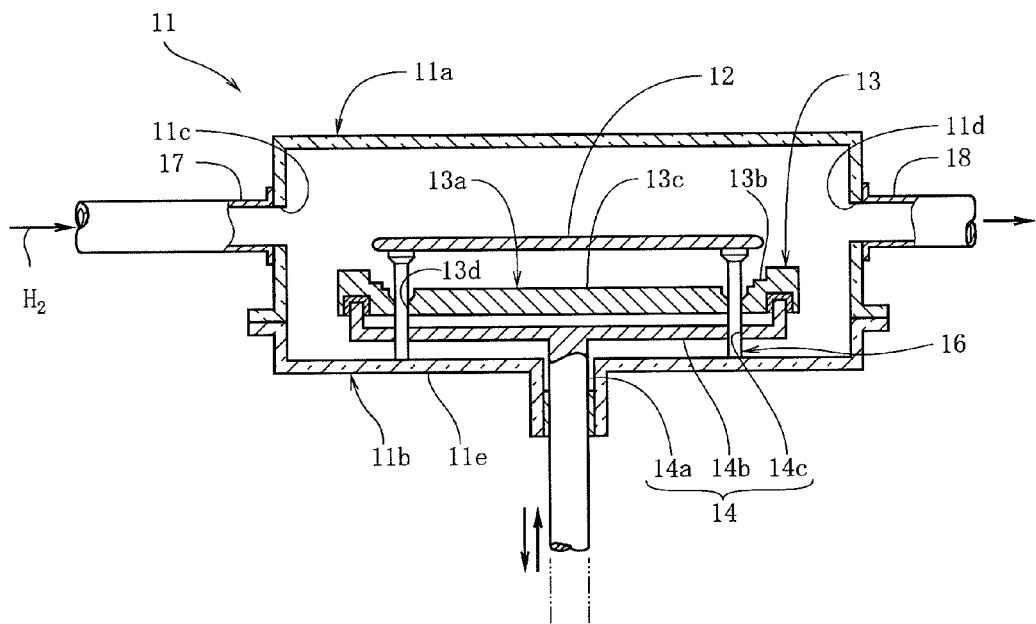
FIG. 3 is a longitudinal cross-sectional structural view associated with FIG. 1, showing a state that a carrier blade receives the silicon wafer temporarily held by the lift pin.

A method for manufacturing an epitaxial wafer by using the thus configured epitaxial wafer manufacturing apparatus will now be described. First, the rotary shaft 14 is relatively moved down with respect to the reaction chamber 11 (FIG. 2). As a result, a lower end of the lift pin 16 comes into contact with the upper surface of the lower wall 11e of the lower dome 11b, and the top portion 16d of the lift pin 16 protrudes upward from the upper surface of the susceptor 13. In this state, a carrier blade 19 having the silicon wafer 12 mounted thereon is inserted into the reaction chamber 11, and the silicon wafer 12 is placed on the lift pin 16, thereby temporarily holding the silicon wafer 12 by using the lift pin 16 (FIG. 3). Then, the rotary shaft 14 is relatively moved up with respect to the reaction chamber 11. As a result, the lower end of the lift pin 16 moves apart from the upper surface of the lower wall 11e of the lower dome 11b, and the lift head portion 16c of the lift pin 16 is accommodated in the large-diameter bore portion 13g of the through bore 13d (FIG. 1). At this time, the lift tapered portion 16b of the lift pin 16 comes into contact with the tapered bore portion 13f of the through bore 13d, whereby the height h of the top portion 16d of the lift pin 16 falls within the range from the position where the height h exceeds 0 mm to the position immediately before the lift pin 16 comes into contact with the silicon wafer 12. Additionally, a lower surface of the outer peripheral portion of the silicon wafer 12 is placed on the upper surface of the step portion 13b, thus accommodating the silicon wafer 12 in the recessed portion 13a.

In this state, the raw material gas is introduced together with the carrier gas into the reaction chamber 11 through the gas introduction tube 17 and the gas supply opening 11c while heating the silicon wafer 12 by the upper lamp and the lower lamp. It is to be noted that, usually, the upper lamp and the lower lamp are turned on and the carrier gas is flowed into the reaction chamber 11 before inserting the silicon wafer 12 into the reaction chamber 11. When the raw material gas introduced together with the carrier gas reaches the surface of the silicon wafer 12, an epitaxial layer consisting of a silicon single crystal thin film is formed on the surface of the silicon wafer 12. Specifically, irregularities are not formed on the epitaxial layer at a position where the epitaxial layer faces the lift pin 16 and silicon is not deposited on the back surface of the silicon wafer 12 even though (Wa:Wb) is changed to fall within the range of (50:50) to (55:45) where Wa is an output of the upper lamp and Wb is an output of the lower lamp. In other words, even if the output of the lower lamp larger than the output of the upper lamp (Wa:Wb in the conventional technology is fixed to 42:58) is reduced to be lower than a value in the conventional technology so that both the lamps can have substantially the same outputs, deposition of the silicon on the back surface of the silicon wafer 12 can be suppressed while maintaining planarization of the epitaxial layer, thus improving a quality of an epitaxial wafer. The raw material gas and others having passed through the surface of the silicon wafer 12 are discharged via the gas discharge opening 11d and the gas discharge tube 18.

When formation of the epitaxial layer on the surface of the silicon wafer 12 is completed, the rotary shaft 14 is relatively moved down with respect to the reaction chamber 11. As a result, the lower end of the lift pin 16 comes into contact with the upper surface of the lower wall 11e of the lower dome 11b, and the top portion 16d of the lift pin 16 comes into contact with the lower surface of the silicon wafer 12, whereby the lift pin 16 pushes up the silicon wafer 12 (FIG. 3). Subsequently, when the carrier blade 19 is inserted between the silicon wafer 12 and the susceptor 13, and then this blade 19 is moved up, thereby mounting the silicon wafer 12 onto the blade 19 (FIG. 2). As a result, the silicon wafer 12 having the epitaxial layer formed thereon can be taken out from the reaction chamber 11. It is to be noted that the silicon wafer is used as a semiconductor wafer in this embodiment, but a GaAs wafer, an InP wafer, a ZnS wafer, or a ZnSe wafer may be adopted.

EXAMPLE

Next, examples according to the present invention are explained together with comparative examples.

Example 1

A transverse single-wafer processing epitaxial growth apparatus which is of a lamp heating type (manufactured by AMAT Inc.) was prepared. A ratio of an output Wa of an upper lamp and an output Wb of a lower lamp (Wa:Wb) in this apparatus was first set to 50:50, and a carrier gas (H$_2$) was flowed. In this state, a rotary shaft 14 was relatively moved down with respect to a reaction chamber 11 (FIG. 2). As a result, a lower end of a lift pin 16 came into contact with an upper surface of a lower wall 11e of a lower dome 11b, and a top portion 16d of the lift pin 16 protruded upwards from an upper surface of a susceptor 13. In this state, a carrier blade 19 having a p-type silicon wafer 12, which has a crystal plane direction of <100> and a diameter of 300 mm, mounted thereon was inserted into the reaction chamber 11, and the silicon wafer 12 was placed on the lift pin 16, thereby temporarily holding the silicon wafer 12 by the lift pin 16 (FIG. 3). Then, the rotary shaft 14 was relatively moved up with respect to the reaction chamber 11. As a result, the lower end of the lift pin 16 was separated from the upper surface of the lower wall 11e of the lower dome 11b, and a lift head portion 16c of the lift pin 16 was accommodated in a large-diameter bore portion 13g of a through bore 13d (FIG. 1). At this moment, a lift tapered portion 16b of the lift pin 16 came into contact with a tapered bore portion 13f of the through bore 13d, and a height h of the top portion 16d of the lift pin 16 was +0.05 mm. That is, the lift pin 16 protruded upwards 0.05 mm from the upper surface of the bottom wall 13c. Further, a lower surface of an outer peripheral portion of the silicon wafer 12 was mounted on an upper surface of a step portion 13b, and the silicon wafer 12 was thereby accommodated in a recessed portion 13a. In this state, the silicon wafer 12 was heated by the upper lamp and the lower lamp while maintaining the output ratio Wa:Wb of these lamps at 50:50, a raw material gas (SiHCl$_3$) was introduced together with a carrier gas (H$_2$) into the reaction chamber 11 through a gas introduction tube 17 and a gas supply opening 11c, and an epitaxial layer consisting of a silicon single crystal thin film having a thickness of 3 μm was formed on a surface of the silicon wafer 12, thereby fabricating an epitaxial wafer. It is to be noted that a distance H between an extended surface of the upper surface of the step portion 13b of the susceptor 13 and an extended surface of the upper surface of the bottom wall 13c in the recessed portion 13a of the susceptor 13 at a position of the lift pin 16 was 0.3 mm, and a temperature at a central portion of the silicon wafer measured by a radiation thermometer was 1100° C.

Example 2

An epitaxial wafer was fabricated under the same conditions as those in Example 1 except that the ratio of the output Wa of the upper lamp and the output Wb of the lower lamp (Wa:Wb) was set to 55:45.

Example 3

An epitaxial wafer was fabricated under the same conditions as those in Example 1 except that the height h of the top portion of the lift pin was +0.12 mm when the lift head portion of the lift pin was accommodated in the large-diameter bore portion of the through hole (the lift pin protruded upwards 0.12 mm from the upper surface of the bottom wall).

Example 4

An epitaxial wafer was fabricated under the same conditions as those in Example 1 except that the ratio of the output Wa of the upper lamp and the output Wb of the lower lamp (Wa:Wb) was set to 55:45 and the height h of the top portion of the lift pin was +0.12 mm when the lift head portion of the lift pin was accommodated in the large-diameter bore portion of the through hole (the lift pin protruded upwards 0.12 mm from the upper surface of the bottom wall).

Comparative Example 1

An epitaxial wafer was fabricated under the same conditions as those in Example 1 except that the ratio of the output Wa of the upper lamp and the output Wb of the lower lamp (Wa:Wb) was set to 42:58.

Comparative Example 2

An epitaxial wafer was fabricated under the same conditions as those in Example 1 except that the ratio of the output Wa of the upper lamp and the output Wb of the lower lamp (Wa:Wb) was set to 46:54.

Comparative Example 3

An epitaxial wafer was fabricated under the same conditions as those in Example 1 except that the ratio of the output Wa of the upper lamp and the output Wb of the lower lamp (Wa:Wb) was set to 42:58 and the height h of the top portion of the lift pin was +0.12 mm when the lift head portion of the lift pin was accommodated in the large-diameter bore portion of the through bore (the lift pin protruded upwards 0.12 mm from the upper surface of the bottom wall).

Comparative Example 4

An epitaxial wafer was fabricated under the same conditions as those in Example 1 except that the ratio of the output Wa of the upper lamp and the output Wb of the lower lamp (Wa:Wb) was set to 46:54 and the height h of the top portion of the lift pin was +0.12 mm when the lift head portion of the lift pin was accommodated in the large-diameter bore portion of the through bore (the lift pin protruded upwards 0.12 mm from the upper surface of the bottom wall).

Comparative Example 5

An epitaxial wafer was fabricated under the same conditions as those in Example 1 except that the ratio of the output Wa of the upper lamp and the output Wb of the lower lamp (Wa:Wb) was set to 42:58, the height h of the top portion of the lift pin was +0.25 mm when the lift head portion of the lift pin was accommodated in the large-diameter bore portion of the through bore (the lift pin protruded upwards 0.25 mm from the upper surface of the bottom wall), and the top portion of the lift pin was in contact with the back surface of the silicon wafer.

Comparative Example 6

An epitaxial wafer was fabricated under the same conditions as those in Example 1 except that the ratio of the output Wa of the upper lamp and the output Wb of the lower lamp (Wa:Wb) was set to 55:45, the height h of the top portion of the lift pin was +0.25 mm when the lift head portion of the lift pin was accommodated in the large-diameter bore portion of the through bore (the lift pin protruded upwards 0.25 mm from the upper surface of the bottom wall), and the top portion of the lift pin was in contact with the back surface of the silicon wafer.

Comparative Example 7

An epitaxial wafer was fabricated under the same conditions as those in Example 1 except that the ratio of the output Wa of the upper lamp and the output Wb of the lower lamp (Wa:Wb) was set to 42:58 and the height h of the top portion of the lift pin was −0.7 mm when the lift head portion of the lift pin was accommodated in the large-diameter bore portion of the through bore (the top portion of the lift pin receded 0.7 mm into the through bore from the upper surface of the bottom wall).

Comparative Example 8

An epitaxial wafer was fabricated under the same conditions as those in Example 1 except that the ratio of the output Wa of the upper lamp and the output Wb of the lower lamp (Wa:Wb) was set to 46:54 and the height h of the top portion of the lift pin was −0.7 mm when the lift head portion of the lift pin was accommodated in the large-diameter bore portion of the through bore (the top portion of the lift pin receded 0.7 mm into the through bore from the upper surface of the bottom wall).

Comparative Example 9

An epitaxial wafer was fabricated under the same conditions as those in Example 1 except that the height h of the top portion of the lift pin was −0.7 mm when the lift head portion of the lift pin was accommodated in the large-diameter bore portion of the through bore (the top portion of the lift pin receded 0.7 mm into the through bore from the upper surface of the bottom wall).

Comparative Example 10

An epitaxial wafer was fabricated under the same conditions as those in Example 1 except that the ratio of the output Wa of the upper lamp and the output Wb of the lower lamp (Wa:Wb) was set to 55:45 and the height h of the top portion of the lift pin was −0.7 mm when the lift head portion of the lift pin was accommodated in the large-diameter bore portion of the through bore (the top portion of the lift pin receded 0.7 mm into the through bore from the upper surface of the bottom wall).

Comparative Example 11

An epitaxial wafer was fabricated under the same conditions as those in Example 1 except that the ratio of the output Wa of the upper lamp and the output Wb of the lower lamp (Wa:Wb) was set to 42:58 and the height h of the top portion of the lift pin was 0 mm when the lift head portion of the lift pin was accommodated in the large-diameter bore portion of the through bore (the top portion of the lift pin was level with the upper surface of the bottom wall).

Comparative Example 12

An epitaxial wafer was fabricated under the same conditions as those in Example 1 except that the ratio of the output Wa of the upper lamp and the output Wb of the lower lamp (Wa:Wb) was set to 46:54 and the height h of the top portion of the lift pin was 0 mm when the lift head portion of the lift pin was accommodated in the large-diameter bore portion of the through bore (the top portion of the lift pin was level with the upper surface of the bottom wall).

Comparative Example 13

An epitaxial wafer was fabricated under the same conditions as those in Example 1 except that the height h of the top portion of the lift pin was 0 mm when the lift head portion of the lift pin was accommodated in the large-diameter bore portion of the through bore (the top portion of the lift pin was level with the upper surface of the bottom wall).

Comparative Example 14

An epitaxial wafer was fabricated under the same conditions as those in Example 1 except that the ratio of the output Wa of the upper lamp and the output Wb of the lower lamp (Wa:Wb) was set to 55:45 and the height h of the top portion of the lift pin was 0 mm when the lift head portion of the lift pin was accommodated in the large-diameter bore portion of the through bore (the top portion of the lift pin was level with the upper surface of the bottom wall).

Comparative Test 1 and Evaluation

Back surface deposition and a nanotopography of the epitaxial wafer according to each of Examples 1 to 4 and Comparative Examples 1 to 14 were measured. Table 1 shows a result of this measurement. Here, the back surface deposition means a phenomenon that a silicon film that covers a susceptor surface is delaminated by a chloride component in the raw material gas ($SiHCl_3$) to be deposited on the high-temperature back surface of the silicon wafer. This back surface deposition was determined based on a difference between a thickness of the silicon wafer before forming the epitaxial layer and a thickness of the epitaxial wafer after forming the epitaxial layer. In a column of the back surface deposition in Table 1, "Ref" means that the back surface deposition when the ratio of the output Wa of the upper lamp and the output Wb of the lower lamp (Wa:Wb) was set to 42:58, i.e., the back surface deposition in each of Comparative Examples 1, 3, 5, 7, and 11 is determined as a reference value. Further, in the column of the back surface deposition in Table 1, "B" means that the back surface deposition was reduced less than 20% alone from the reference value, "A" means that the back surface deposition was relatively greatly reduced 20% or more and less than 40% from the reference value, and "AA" means that the back surface deposition was very greatly reduced 40% or more and less than 65% from the reference value. On the other hand, the nanotopography is an indicator of flatness of the epitaxial layer surface of the epitaxial wafer. This nanotopography was measured by Nanomapper (manufactured by ADE Corporation). In a column of the nanotopography in Table 1, "A" means that irregularities were as small as less than 5 nm, "B" means that irregularities were as relatively large as over 5 nm and 10 nm or below, and "BB" means that irregularities were as very large as 10 nm or above.

TABLE 1

| | Output ratio of upper lamp and lower lamp | Height of top portion of lift pin (mm) | Back surface deposition | Nanotopography |
|---|---|---|---|---|
| Example 1 | 50:50 | +0.05 | A | A |
| Example 2 | 55:45 | +0.05 | AA | A |
| Example 3 | 50:50 | +0.12 | A | A |
| Example 4 | 55:45 | +0.12 | AA | A |
| Comparative Example 1 | 42:58 | +0.05 | Ref | A |
| Comparative Example 2 | 46:54 | +0.05 | B | A |
| Comparative Example 3 | 42:58 | +0.12 | Ref | A |

TABLE 1-continued

|  | Output ratio of upper lamp and lower lamp | Height of top portion of lift pin (mm) | Back surface deposition | Nanotopography |
|---|---|---|---|---|
| Comparative Example 4 | 46:54 | +0.12 | B | A |
| Comparative Example 5 | 42:58 | +0.25 | Ref | BB |
| Comparative Example 6 | 55:45 | +0.25 | A | BB |
| Comparative Example 7 | 42:58 | −0.7 | Ref | A |
| Comparative Example 8 | 46:54 | −0.7 | B | A |
| Comparative Example 9 | 50:50 | −0.7 | A | B |
| Comparative Example 10 | 55:45 | −0.7 | AA | BB |
| Comparative Example 11 | 42:58 | 0 | Ref | A |
| Comparative Example 12 | 46:54 | 0 | B | A |
| Comparative Example 13 | 50:50 | 0 | A | B |
| Comparative Example 14 | 55:45 | 0 | AA | BB |

As apparent from Table 1, in Comparative Examples 7 to 10 in which the height h of the top portion of the lift pin is −0.7 mm or Comparative Examples 11 to 14 in which the height h of the top portion of the lift pin is 0 mm, the back surface deposition was gradually improved as the output of the lower lamp was decreased, but the nanotopography was gradually deteriorated. In Comparative Examples 7 to 14, both the back surface deposition and the nanotopography were poor. Further, in each of Comparative Examples 5 and 6 in which the top portion is in contact with the silicon wafer back surface, the back surface deposition was improved as the output of the lower lamp was decreased, but the nanotopography was deteriorated. On the other hand, in each of Examples 1 and 2 in which the height of the top portion of the lift pin is +0.05 mm or Examples 3 and 4 in which the height of the top portion of the lift pin is +0.12 mm, both the back surface deposition and the nanotopography were excellent. As a result, it was understood that, when the height h of the top portion of the lift pin based on the upper surface of the bottom wall of the susceptor as the reference is set to fall within the range from the position at which the height h exceeds 0 mm and to the position immediately before the lift pin comes into contact with the silicon wafer, both the back surface deposition and the nanotopography are improved.

On the other hand, in each of Comparative Examples 1 to 4 in which the height h of the top portion of the lift pin is +0.05 mm or +0.12 mm but the output of the lower lamp is larger than the output of the upper lamp, the nanotopography was excellent but the back surface deposition was poor. In each of Examples 1 to 4 in which the height h of the top portion of the lift pin is +0.05 mm or +0.12 mm but the output of the lower lamp is equal to or slightly lower than the output of the upper lamp, both the nanotopography and the back surface deposition were excellent. As a result, it can be understood that, when the height h of the top portion of the lift pin based on the upper surface of the bottom wall of the susceptor as the reference is set to fall within the range from the position at which the height h exceeds 0 mm to the position immediately before the lift pin comes into contact with the silicon wafer, not only the nanotopography but also the back surface deposition can be improved even though the outputs of the upper lamp and the lower lamp are set to be substantially equal to each other or the output of the upper lamp is set to be larger than the output of the lower lamp.

INDUSTRIAL APPLICABILITY

The present invention can be used for forming an epitaxial layer on a surface of a semiconductor wafer such as a silicon wafer mounted on the susceptor in the reaction chamber while holding and rotating this semiconductor wafer by the holder.

What is claimed is:

1. A method for manufacturing an epitaxial wafer, comprising:
arranging in a reaction chamber a susceptor that has a recessed portion and a ring-like step portion formed in the recessed portion and has a plurality of through bores formed in a bottom wall of the recessed portion excluding the step portion;
temporarily holding a wafer by lift pins inserted in the through bores;
mounting a lower surface of an outer peripheral portion of the wafer on the step portion to accommodate the wafer in the recessed portion;
circulating a raw material gas in the reaction chamber to form an epitaxial layer on a surface of the wafer accommodated in the recessed portion,
wherein, each of the lift pins has a lift shaft portion and a lift head portion that is provided on an upper surface of the lift shaft portion, the lift head portion being provided integrally with the lift shaft portion through a lift tapered portion, and the lift head portion having a larger diameter than that of the lift shaft portion, and
wherein a corresponding through bore has a small-diameter bore portion, a tapered bore portion that accommodates the lift tapered portion, and a large-diameter bore portion that accommodates the lift head portion, and an inner surface of the tapered bore portion supports the lift tapered portion such that an upper surface of the lift head portion protrudes outside of the large diameter bore portion, and when forming the epitaxial layer on the wafer surface, each of the lift pins protrudes upwards from an upper surface of the bottom wall, a height h of a top portion of each lift pin based on the upper surface of the bottom wall as a reference is set to fall within the range of 0.05 mm to 0.12 mm and at a position immediately before the lift pin comes into contact with the wafer, and a distance H between an extended surface of an upper surface of the step portion of the susceptor and an extended surface of the upper surface of the bottom wall at a position of the lift pin is 0.1 to 1 mm; and
setting a ratio Wa:Wb to be in a range of 50:50 to 55:45, where Wa is an output of an upper lamp which is provided above the reaction chamber and Wb is an output of a lower lamp which is provided below the reaction chamber.

2. The method for manufacturing an epitaxial wafer according to claim 1, wherein the susceptor is formed of carbon covered with an SiC film and the lift pin is formed of any one of SiC, glassy carbon, and quartz.

* * * * *